United States Patent [19]

Avery et al.

[11] Patent Number: 5,422,582
[45] Date of Patent: Jun. 6, 1995

[54] DIODE COUPLED CMOS LOGIC DESIGN FOR QUASI-STATIC RESISTIVE DISSIPATION WITH MULTI-OUTPUT CAPABILITY

[75] Inventors: Steven C. Avery, Sylvania, Australia; Alexander G. Dickinson, Neptune, N.J.; Thaddeus J. Gabara, Murray Hill, N.J.; Alan H. Kramer, Berkeley, Calif.

[73] Assignee: AT&T Corp., Murray Hill, N.J.

[21] Appl. No.: 175,709

[22] Filed: Dec. 30, 1993

[51] Int. Cl.[6] .......................................... H03K 14/096
[52] U.S. Cl. ...................................... 326/95; 326/136
[58] Field of Search ................. 307/443, 446, 451–452

[56] References Cited

U.S. PATENT DOCUMENTS 3,651,340  3/1972  Cliff ...................... 307/451
3,808,462  4/1974  Parrish et al. ............ 307/446 X
4,142,251  1/1979  Mintz ..................... 307/446 X

OTHER PUBLICATIONS

Younis & Knight, "Practical Implementation of Change Recovering Asympfatically Zero Power CMOS", paper presented at MIT, Oct. 9, 1992.

Roderick T. Hinman and Martin F. Schlecht, "Recovered Energy Logic–A Highly Efficient Alternative to Today's Logic Circuits", PESC 1993, pp. 17–26.

Charles L. Seitz, Alexander H. Frey, Sven Mattisson, Steve D. Rabin, Don A. Speck and Jan L. A. van de Snepscheut, "Hot–Clock nMOS", in Proceedings of the 1985 Chapel Hill Conference on Very Large Scale Integration, Computer Science Press, 1985, pp. 1–17.

Jeffery G. Koller and William C. Athas, "Adiabatic Switching, Low Energy Computing, and the Physics of Storing and Erasing Information", in Proceedings of Physics of Computation Workshop, 1992.

*Primary Examiner*—David R. Hudspeth

[57] ABSTRACT

CMOS logic circuitry powered by the clock signals wherein the addition of strategically placed diodes enables the circuits to behave in an adiabatic-like fashion.

5 Claims, 6 Drawing Sheets

F(A,B,C)=OUT$_1$
F(A,B,C,D,E)=OUT$_2$
14 DEVICES

F(A,B,C,D,E)=OUT$_2$
12 DEVICES

F(A,B,C)=OUT$_1$
8 DEVICES

OUT = $\overline{A \cdot B}$

DIODE COUPLED CMOS LOGIC DESIGN FOR QUASI-STATIC RESISTIVE DISSIPATION WITH MULTI-OUTPUT CAPABILITY

FIELD OF THE INVENTION

The present invention relates to low power dissipation CMOS circuitry suitable for use in portable electronic devices, and in particular to such circuitry which employs diodes coupled therein for quasi-static resistive dissipation and which implements multiple output device-saving capability.

BACKGROUND OF THE INVENTION

Low power circuits are a desirable feature in many electronic systems, especially those which are portable and thus supplied with a limited supply of power. Previously, CMOS was an attractive alternative to emitter coupled logic (ECL), bipolar and other circuit techniques when power dissipation was an issue. However, with CMOS design features in the sub-micron range and the corresponding increase in switching frequency, power dissipation in CMOS is now a concern. Some recent integrated circuit designs dissipate several tens of watts, which in some cases can stress the packaging technology.

It is known that the amount of energy dissipated during the switching process can be reduced by performing the logic switching at low speeds; this is known as adiabatic switching. Adiabatic switching in this context recycles the signal energy, saves it, and later reuses it to represent other information. Importantly, the slower the circuit is operated, the smaller the amount of energy is dissipated during the switching process. For example, FIG. 6 illustrates a prior art CMOS inverter comprised of a pfet in series with an nfet such that the drains of each device are tied together to the output Y. The nfet is a normally off switch; when there is no charge on the gate, there is no connection between the source and the drain. When charge is placed on the gate, the source is connected to the drain. In contrast, the pfet is a normally on switch; when there is no charge on the gate, there is a connection between the source and the drain. When charge is placed on the gate, the source/drain connection is broken. The load capacitance C represents the gate capacitance of the devices to which the inverter is connected. It can be seen that when X is low, the pfet connect Y to the power supply and isolates it from ground; and when X is high, the nfet connects Y to ground and isolates from the power supply. Thus, this device acts as a logic inverter.

When the output is at voltage V, the capacitor has a charge $Q=CV$, and is storing a signal energy $E=\frac{1}{2}CV^2$. Since the power supply had delivered an amount of energy of $QV=CV^2$, the difference $E_h=\frac{1}{2}CV^2$ must have been dissipated as heat in the pfet during the charging process. When the input changes back to 1, the load capacitor is discharged to ground, dissipating the signal energy this time in the nfet. Thus, the total energy dissipated in the entire switching loop is $CV^2$.

Reference is made to FIGS. 7a through 7e. An RC circuit is illustrated in FIG. 7a, in which the resistor R represents an MOS device which has been enabled. Initially, both $\beta_1$ and $V_{out}$ are at low potential. $\beta_1$ applies a step function to the network as shown in FIG. 7b and $V_{out}$ responds exponentially. At $t=0^+$, the full voltage is applied across the resistor R. The energy dissipated is $E_o=\frac{1}{2}CV^2$. If the step is partitioned into two half steps as shown in FIG. 7c, the energy dissipated is $E_o=\frac{1}{4}CV^2$. Less energy is dissipated in the resistor when the step function of the driving signal is partitioned into smaller step sizes. The final voltage in cases (b) and (c) are the same; however, a longer time period is required for FIG. 7c. In FIG. 7d, the step is further partitioned and in the limit approaches the waveform illustrated in FIG. 7e. The dissipated energy for case (e) is given as $(2RC/T)(\frac{1}{2}CV^2)$. As T is increased larger than an RC time constant, the energy dissipated in the resistor can be decreased significantly.

Thus, it is known in the prior art that the transfer of energy through a dissipative medium can dissipate small amounts of energy if the transfer is made slowly enough. A prior art design called "hot-clock nMOS" applied this principle to MOS circuits, and followed two rules: (1) never disable a switch (MOS device) unless the potential across it is zero; and (2) never enable a switch if there is current flowing through it. By following these rules in the design of MOS circuits, very low power dissipation circuits can be created. In addition, DC to DC converters have also followed these design rules in the prior art.

It is an object of the present invention to provide CMOS logic circuits capable of exhibiting adiabatic-like behavior by employing quasi-static resistive dissipation while providing a reduced device count and optionally providing multiple outputs.

SUMMARY OF THE INVENTION

In accordance with these and other objects, the present invention is circuitry for enabling a CMOS circuit to exhibit quasi-static resistive dissipative operation, the circuitry comprising switching diodes coupled in series with clock input signals. In one aspect of the present invention, a pair of diodes are coupled to a pair of input clocks wherein each input clock is 180° out of phase with the other in complementary fashion. In a second aspect of the invention, a pair of diodes are coupled to a CMOS circuit, but in this case only one phase of an input clock is used to drive the circuit. In each instance, the CMOS circuits exhibit quasi-static resistive dissipation and thus behave in an adiabatic-like fashion. An additional requirement is the need for clocks which transfer the data between gates.

BRIEF DESCRIPTION OF THE DRAWING

FIG. 2b is a timing diagram of an exemplary operation of the circuit of FIG. 2a;

DESCRIPTION OF THE PREFERRED EMBODIMENT

In the following detailed description, the clock symbol $\overline{Cx}$ will be understood to mean the same as $\bar{C}x$.

Figure 1A:
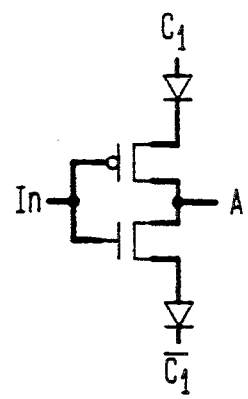
FIG. 1a is a schematic of a single gate in accordance with the present invention.
Figure 1B:
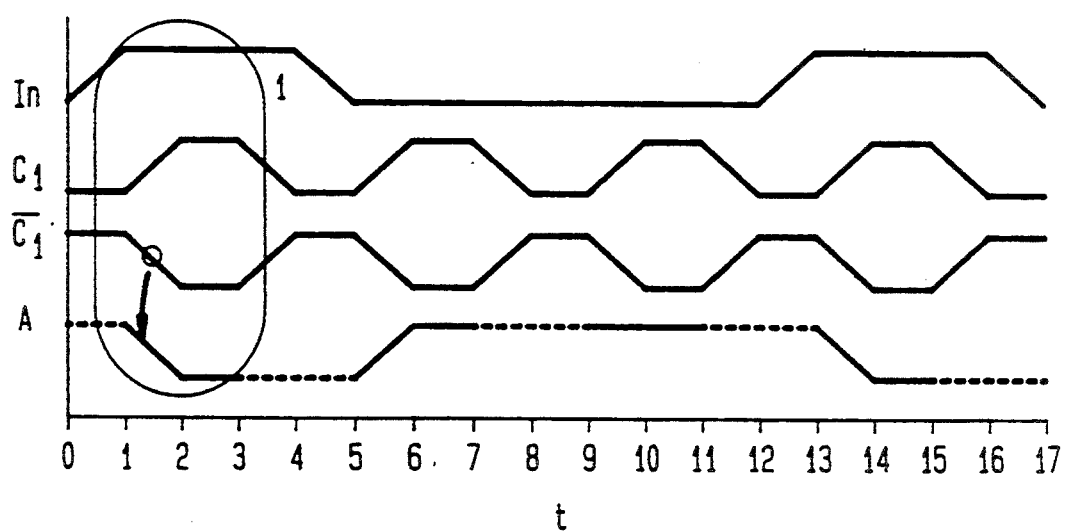
FIG. 1b is a timing diagram for the gate of FIG. 1.

The implementation of diodes coupled with the clocks used for powering CMOS circuits operated in an adiabatic like fashion will now be described in detail with respect to two aspects of the invention. In the first aspect of the invention, a pair of diodes are used in conjunction with a pair of clock signals wherein the clock signals are 180° out of phase with each other. Referring to FIGS. 1a and 1b, a CMOS inverter circuit for shifting the input signal IN to the output node OUT in an adiabatic-like manner is presented. Referring to the timing diagram of FIG. 1b, IN is a logic 1 while C1 rises and $\overline{C1}$ falls (circled area 1), which causes signal A to fall to $\overline{0}$ adiabatically. This occurs one phase after IN changes. Note that the input IN is stable when C1 and $\overline{C1}$ change.

Figure 2A:
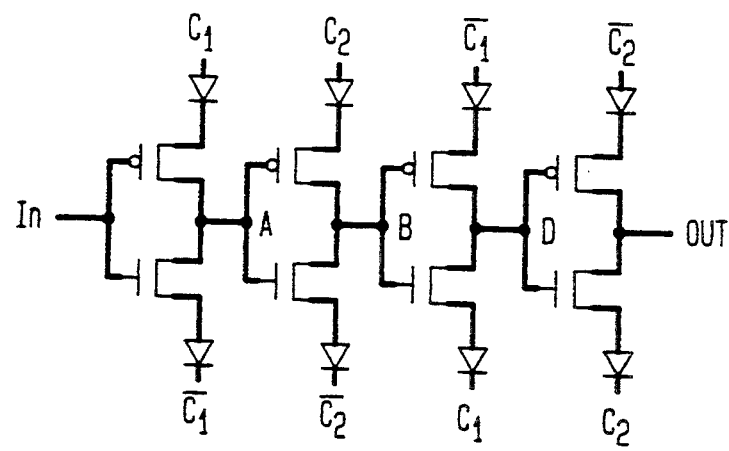
FIG. 2a is a schematic diagram of a four phase CMOS shift register exhibiting adiabatic switching behavior.
Figure 2B:
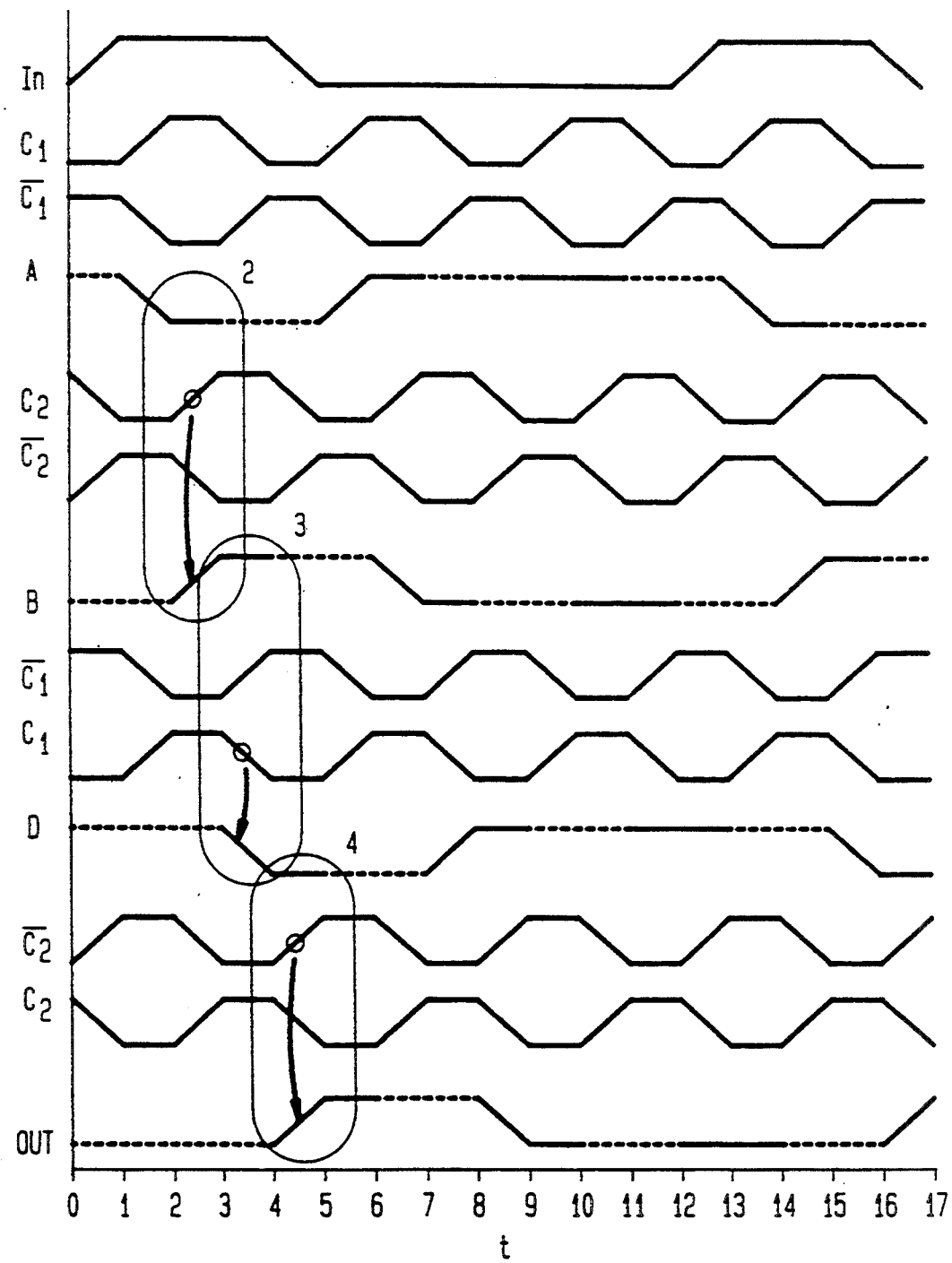

FIGS. 2a and 2b illustrate how the data is transferred between gates. To insure a proper transfer, the clocks C2 and $\overline{C2}$ are introduced which change only when A is stable. When C2 rises and $\overline{C2}$ falls (circled area 2), intermediate signal B rises to a 1. Similarly, when $\overline{C1}$ rises and C1 falls (circled area 3), intermediate signal D is caused to fall to a 0, and when $\overline{C2}$ rises and C2 falls, the output signal OUT is caused to rise. By the same scenario, the falling edge of IN is clocked through the circuit adiabatically so that OUT likewise falls in synchronocity therewith. All generated waveforms (A, B, D, and OUT) have the same form as IN except for delay and/or inversion. Waveforms B and OUT are identical to IN but delayed an even number of phases, while waveforms A and D have inverse polarity and are delayed an odd number of phases from IN.

Figure 3:
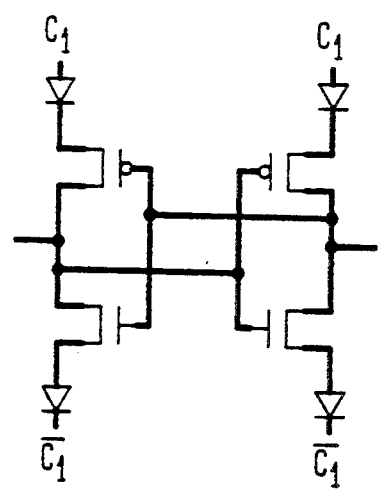
FIG. 3 is an exemplary RAM cell in accordance with the first aspect of the present invention.

Utilizing this design approach, a RAM cell can be fabricated as shown in FIG. 3.

By using these diodes, one can also obtain multi-output logic function gates. This saves on area and device count for recursive functions such as a carry look ahead adder.

Figure 4C:
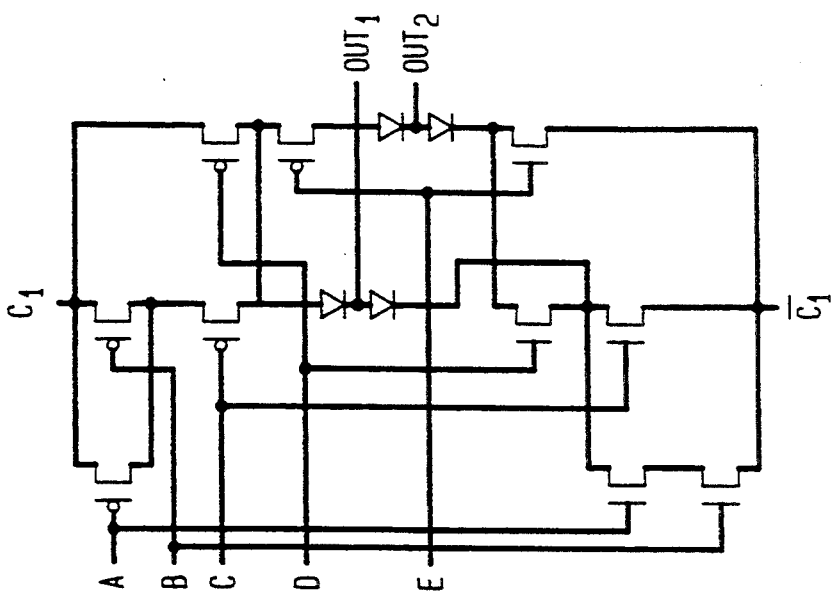
FIGS. 4a, 4b and 4c illustrate one embodiment of the multiple output circuit combining aspect of the first aspect of the present invention.
Figure 4B:
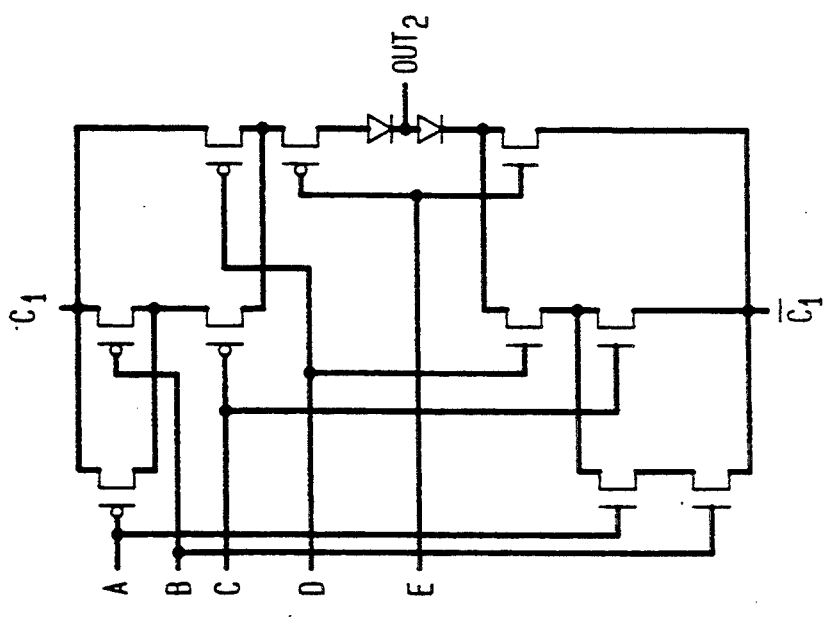
Figure 4A:
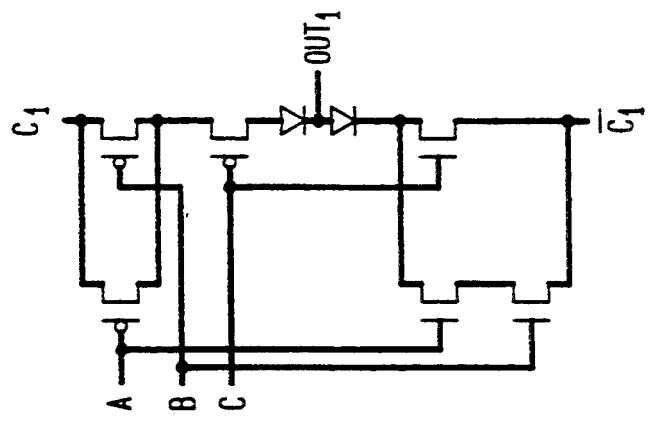

FIGS. 4a, 4b and 4c illustrate the device savings for this multi-output logic design. The 8-device circuit of FIG. 4a can generate F(A,B,C), and the 12-device circuit of FIG. 4b can generate F(A,B,C,D,E). Advantageously, the 14-device circuit of FIG. 4c can generate two outputs; F(A,B,C) and F(A,B,C,D,E). Thus, a savings of 6 devices is achieved, since each circuit implemented alone would result in a total of 20 devices, rather than the 14-device count of the circuit in FIG. 5c. It is observed in addition that these gates can contain more than two outputs as well.

Figure 5:
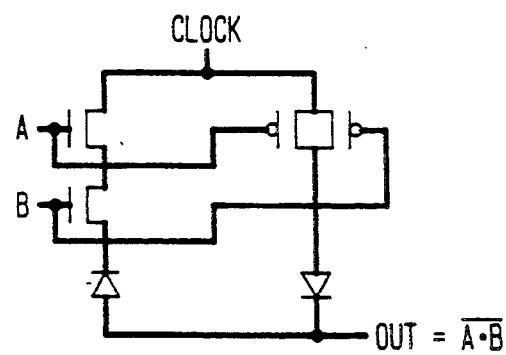
FIG. 5 illustrates a CMOS NAND gate modified in accordance with the second aspect of the present invention.
Figure 6:
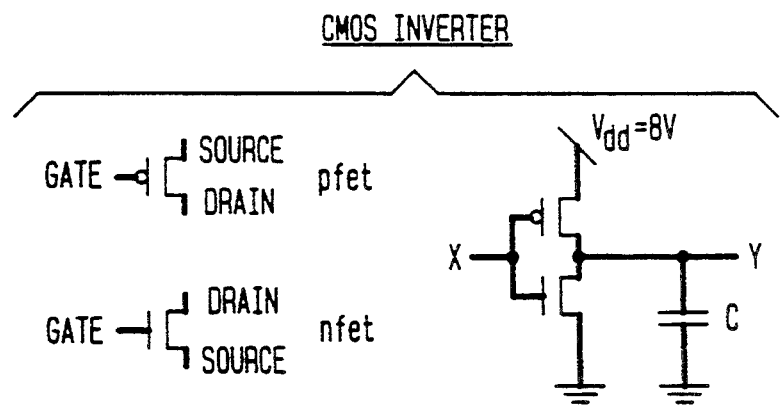
FIG. 6 illustrates a prior art CMOS inverter capable of exhibiting adiabatic switching behavior.
Figure 7A:
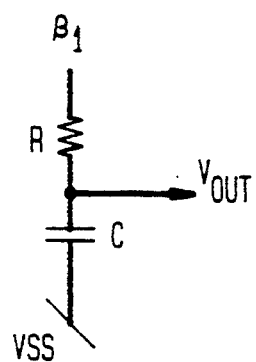
FIGS. 7a, 7b, 7c, 7d and 7e illustrate an RC circuit and various output responses to input step functions.
Figure 7B:
Figure 7C:
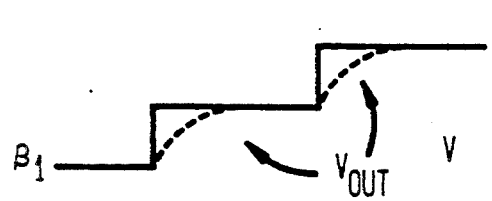
Figure 7D:
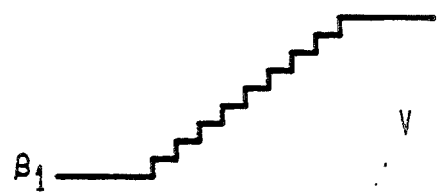
Figure 7E:
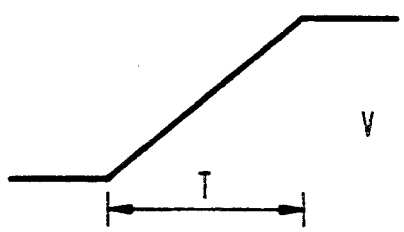

FIG. 5 illustrates a second aspect of the present invention. The CMOS gate shown in FIG. 5 performs the logical NAND function of the two inputs A, B by implementing a single clock input. Here, a pair of diodes are coupled to the gate such that the circuit exhibits adiabatic like power dissipation.

We claim:

1. In a CMOS circuit implementing clock input signals as a means for providing power thereto, circuitry for enabling said CMOS circuit to exhibit quasi-static resistive dissipative operation, said circuitry comprising switching diodes coupled in series with said clock input signals, and means for oscillating said clock input signals between a first and a second clock potential wherein the time $T_c$ for said clock input signals to change between said first and second clock potentials is large enough so as to exhibit quasi-static resistive dissipation.

2. The circuitry of claim 1, wherein the CMOS circuit has at least one data input, said circuitry further comprising a means for applying a data input signal to at least one of said inputs, said data input signal changing between a first and a second data input potential wherein the time $T_{in}$ for said data input signal to change between said first and second data input potentials is large enough so as to exhibit quasi-static resistive dissipation.

3. A CMOS shift register circuit for shifting an input data signal to an output data signal, said shift register being powered by its clock signals and capable of exhibiting quasi-static resistive dissipative behavior, said circuit comprising n shift stages coupled in series, wherein each stage comprises a pfet, an nfet, a first diode and a second diode, wherein the gate of the nfet and the gate of the pfet are coupled together and form an input lead, the source of the pfet is coupled to the cathode of a first diode, the drain of the pfet is coupled to the drain of the nfet and forms an output lead, the drain of the nfet is coupled to the anode of the second diode, and wherein the anode of the first diode is powered by a first clock signal and the cathode of the second diode is powered by the complement of the first clock signal, wherein the input lead of the first stage is the input data signal, the output lead of the nth stage is the output data signal, and the output lead of each stage is coupled to the input lead of the next stage so as to form said series shift register, and wherein the clocks powering each stage are 90° out of phase from the next stage, 4. A CMOS gate powered by a clock signal, comprising a pair of nfets and a pair of pfets coupled so as to provide the boolean logic NAND function, wherein a pair of diodes are coupled in series with the output of the NAND gate so as to provide adiabatic-like operation.

5. The CMOS gate of claim 4, further comprising a means for oscillating said clock input signal between a first and a second clock potential and wherein the time $T_c$ for said clock input signal to change between said first and second clock potentials is large enough so as to provide adiabatic-like operation.

* * * * *